(12) United States Patent
Muramatsu

(10) Patent No.: US 6,646,708 B1
(45) Date of Patent: Nov. 11, 2003

(54) ELECTROOPTIC DEVICE, MANUFACTURING METHOD THEREFOR WITH VISUAL CONFIRMATION OF COMPRESSION BONDING TO TERMINALS AND ELECTRONIC APPARATUS

(75) Inventor: Eiji Muramatsu, Toyashina-machi (JP)

(73) Assignee: Seiko Epson Corporation (JP)

( * ) Notice: Subject to any disclaimer, the term of this patent is extended or adjusted under 35 U.S.C. 154(b) by 251 days.

(21) Appl. No.: 09/857,582

(22) PCT Filed: Sep. 14, 2000

(86) PCT No.: PCT/JP00/06331

§ 371 (c)(1), (2), (4) Date: Jun. 5, 2001

(87) PCT Pub. No.: WO01/26079

PCT Pub. Date: Apr. 12, 2001

(30) Foreign Application Priority Data

Oct. 6, 1999 (JP) .......................................... 11-285590

(51) Int. Cl.[7] .............................................. G02F 1/1345
(52) U.S. Cl. ........................................ 349/149; 349/152
(58) Field of Search ................................... 349/149, 150, 349/152; 324/770; 438/15, 16

(56) References Cited

FOREIGN PATENT DOCUMENTS

| JP | 3-54524 | 3/1991 |
|---|---|---|
| JP | 06-003689 | 1/1994 |
| JP | 06-152112 | 5/1994 |
| JP | 07-211374 | 8/1995 |
| JP | 08-036191 | 2/1996 |
| JP | 08-062613 | 3/1996 |
| JP | 08-095073 | 4/1996 |
| JP | 08-255958 | 10/1996 |
| JP | 08-271925 | 10/1996 |
| JP | 08-330393 | 12/1996 |
| JP | 09-034372 | 2/1997 |

*Primary Examiner*—Robert H. Kim
*Assistant Examiner*—T. L. Rude
(74) *Attorney, Agent, or Firm*—Harness, Dickey & Pierce, P.L.C.

(57) ABSTRACT

A liquid crystal device having high reliability and permitting recognition of a connection state using ACF, and an electronic apparatus including the liquid crystal device, in which a pair of substrates 11a and 11b having electrodes 15a and 15b formed on the opposite surfaces thereof are opposed to each other, an overhang portion 30 is provided on the substrate 11a to project outward from the substrate 11b, terminals 31 are formed on the overhang portion 30 to extend from the electrodes 15a, and output terminals 25a of an external circuit are electrically connected to the terminals 31 through AFC 32 so that conductive particles 32b contained in the AFC 32 cut into the terminals 31 to form nicks or gouges which are visible through the transparent substrate 11a.

34 Claims, 8 Drawing Sheets

(a)

(b)

ELECTROOPTIC DEVICE, MANUFACTURING METHOD THEREFOR WITH VISUAL CONFIRMATION OF COMPRESSION BONDING TO TERMINALS AND ELECTRONIC APPARATUS

TECHNICAL FIELD

The present invention relates to an electrooptic device, for example, such as a liquid crystal device, an EL (electroluminescence) display device, PDP (plasma display panel), or the like. The present invention also relates to an electronic apparatus comprising the electrooptic device.

BACKGROUND ART

At present, an electrooptic device for displaying information such as characters, figures, patterns, etc. is widely used in an electronic apparatus such as a portable telephone, a personal digital assistant, and the like.

In a liquid crystal device as an example of such electrooptic devices, for example, scanning electrodes formed on one of substrates and selective (data) electrodes formed on the other substrate are crossed each other at a plurality of points in a dot matrix to form a plurality of pixels. A liquid crystal is sealed between both substrates so that light passing through the liquid crystal in each of the pixels is modulated by selectively changing the voltage applied to each of the pixels to display an image such as a character or the like. A so-called reflective or transflective liquid crystal device uses a metal which is also used as a reflecting plate as a material for the scanning electrodes or the selective electrodes, and particularly aluminum is selected as a preferred material for the electrode material.

On the other hand, in the electrooptic device, in order to secure a portion of connection with electrooptic device driving IC, or an external circuit additionally connected to another electrooptic panel, the scanning electrodes or the selective electrodes are extended to the end of one of the substrates to secure connecting terminals for securing connection with the external circuit. Also a thermal compression bonding method using ACF (anisotropic conductive film) is known as the method of connecting the connecting terminals of the electrooptic panel with the external circuit.

However, in using aluminum for the scanning electrodes or the selective electrodes, the connecting terminals are made of aluminum, and thus the quality of connection mounting in the connecting step using ACF cannot be easily recognized, thereby causing the problem of failing to secure the reliability of the electrooptic device.

Namely, with the connecting terminals comprising transparent electrodes made of ITO or the like, the state of ACF can be easily observed from the back of one of the substrates, and a decision can relatively easily be made as to whether or not the connection state is good. However, with the connecting terminals made of aluminum, the connecting terminals are opaque, and the state of ACF cannot be easily observed from the back of the substrate.

It is an object of the present invention to provide an electrooptic device permitting recognition of a connection state using ACF and having high reliability, and an electronic apparatus comprising the electrooptic device.

DISCLOSURE OF INVENTION

As means for achieving the object of the present invention, an electrooptic device of the present invention comprises a transparent substrate and a counter substrate opposed to each other and comprising electrodes formed on the opposed surfaces thereof, an overhang portion provided on the transparent substrate to overhang outward from the counter substrate, connecting terminals made of aluminum and formed on the overhang portion to be electrically connected to the electrodes, a connection portion of an external circuit electrically connected to the connecting terminals through an anisotropic conductive film, wherein nicks or gouges formed by conductive particles contained in the anisotropic conductive film and cutting into the connecting terminals are visible through the transparent substrate.

In the electrooptic device, the nicks or gouges formed by the conductive particles contained in the anisotropic conductive film and cutting into the connecting terminals are visible through the transparent substrate, and thus the connecting terminals can be observed through transparent electrodes after the connection portion of the external circuit is connected to the connecting terminals in the manufacturing process to permit a decision as to whether or not the connection state is normal.

The connecting terminals may be formed to a thickness of 0.01 to 0.5 $\mu$m.

In this case, the connection state between the connection portion of the external circuit and the connecting terminals can be improved, and the nicks or gouges can easily be observed.

The penetration amount of the nicks or gouges may be 0.01 $\mu$m or more.

In this case, the connection state between the connection portion of the external circuit and the connecting terminals can be improved, and the nicks or gouges can easily be observed.

In the area of the nicks or gouges, the connecting terminals may have a thickness of 0.5 $\mu$m or less.

In this case, the nicks or gouges can easily be observed.

The electrooptic device may be used as a liquid crystal device.

The method of manufacturing an electrooptic device of the present invention comprising a transparent substrate and a counter substrate opposed to each other and comprising electrodes formed on the opposed surfaces thereof, an overhang portion provided on the transparent substrate to overhang outward from the counter substrate, connecting terminals made of aluminum and formed on the overhang portion to be electrically connected to the electrodes, and a connection portion of an external circuit electrically connected to the connecting terminals through an anisotropic conductive film, the method comprising the step of heating the anisotropic conductive film and compression-bonding the connecting terminals and the connection portion of the external circuit to electrically connect the connecting terminals to the connection portion of the external circuit, and the step of deciding the connection state between the connecting terminals and the connection portion of the external circuit based on the presence of nicks or gouges formed by the conductive particles contained in the anisotropic conductive film and cutting into the connecting terminals.

In the method of manufacturing the electrooptic device, the connection state between the connecting terminals and the connection portion of the external circuit is decided based on the presence of the nicks or gouges formed by the conductive particles contained in the anisotropic conductive film and butting into the connecting terminals, and the connection state between the connecting terminals and the external circuit can easily and securely be decided.

An electronic apparatus of the present invention comprises the electrooptic device as the above-described means.

In the electronic apparatus, the nicks or gouges formed by the conductive particles contained in the anisotropic conductive film and butting into the connecting terminals are visible through the transparent substrate, and thus the connecting terminals can be observed through transparent electrodes after the connection portion of the external circuit is connected to the connecting terminals in the manufacturing process to permit a decision as to whether or not the connection state is normal.

BRIEF DESCRIPTION OF THE DRAWINGS

FIG. 7 is a drawing showing a connection between bumps of liquid crystal driving IC and an aluminum electrode, in which FIG. 7(a) is a sectional view showing a state in which a good connection state is obtained, and FIG. 7(b) is a drawing showing a case in which heat or pressure applied by a heating compression bonding head is insufficient.

Best Mode for Carrying Out the Invention

First Embodiment

A liquid crystal device according to a first embodiment of the present invention will be described as an example of electrooptic devices of the present invention with reference to FIGS. 1 to 3.

Figure 1:
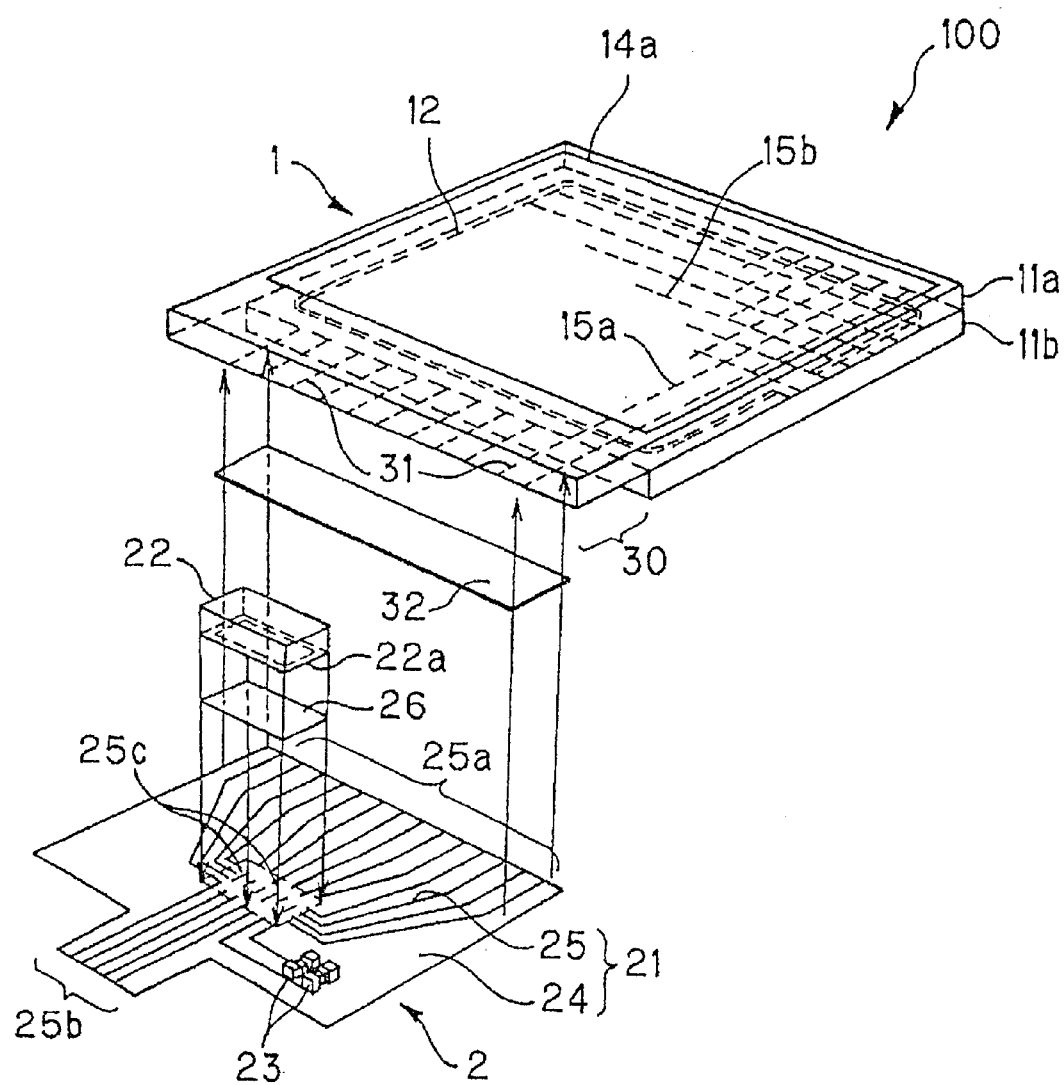
FIG. 1 is an exploded perspective view showing a liquid crystal device in accordance with a first embodiment of the present invention.
Figure 2:
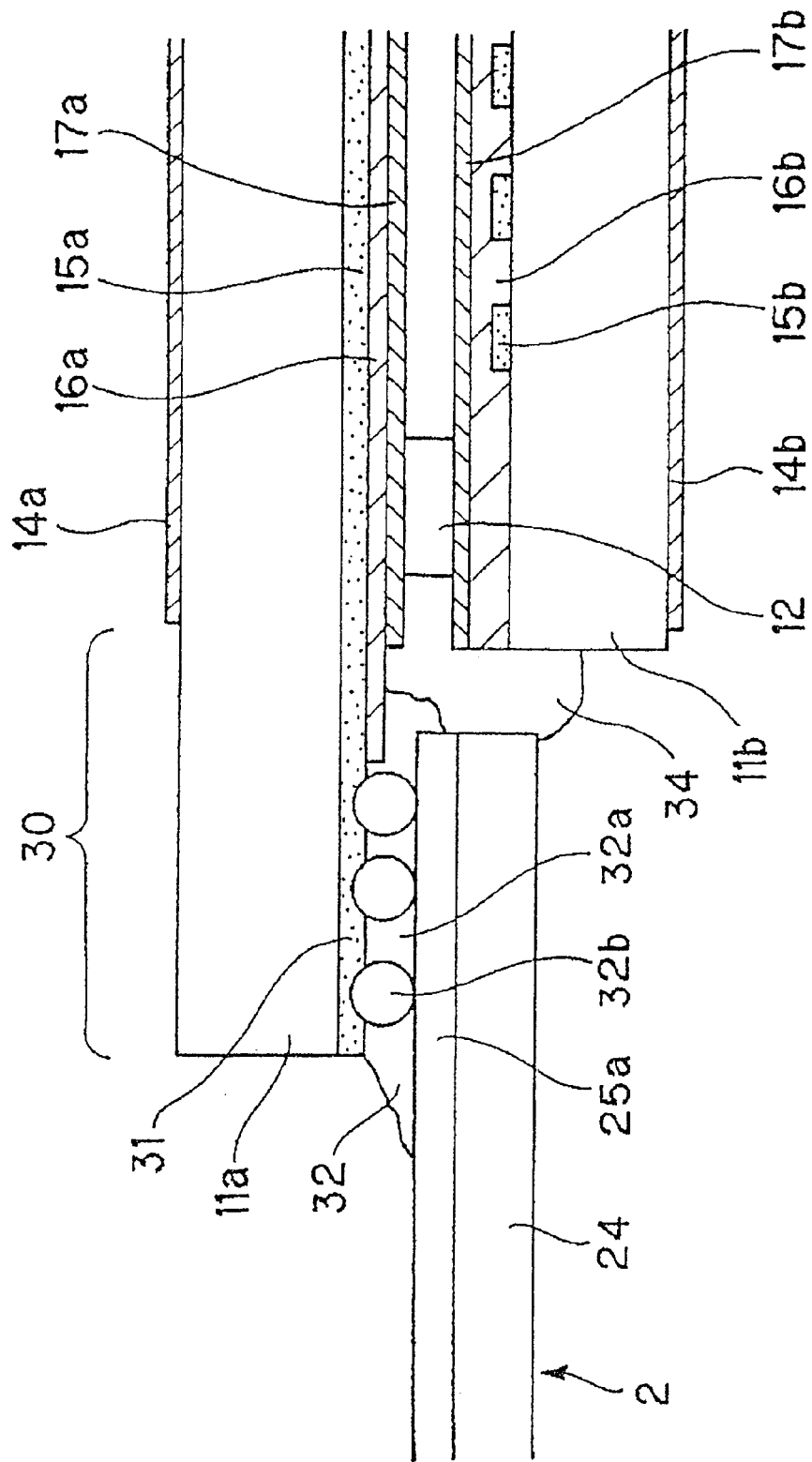
FIG. 2 is a sectional view of the liquid crystal device of the first embodiment.

FIG. 1 is an exploded perspective view showing a liquid crystal device of this embodiment, and FIG. 2 is a sectional view showing the connection between a liquid crystal panel 1 and a mounting structure 2 (external circuit). As shown in FIG. 1, a liquid crystal device 100 comprises the liquid crystal panel 1 for displaying information, and the mounting structure 2 connected to the liquid crystal panel 1. If required, an illumination device such as a back light, or the like, and other additional devices (not shown) are mounted to the liquid crystal panel 1.

The liquid crystal panel 1 comprises a pair of substrates 11a and 11b made of a light transmitting material such as glass, a synthetic resin, or the like. The substrates 11a and 11b are bonded together by using a sealing material 12 arranged in the peripheries of both substrates, and a liquid crystal is sealed in the space, i.e., the cell gap, formed between the substrates 11a and 11b in the region surrounded by the sealing material 12. Furthermore, polarizers 14a and 14b are bonded to the outer surfaces of the substrates 11a and 11b, respectively.

As shown in FIG. 1, a plurality of aluminum electrodes 15a are formed in a stripe shape on the inner surface of the substrate 11a, and a plurality of transparent electrodes 15b are formed in a stripe shape on the inner surface of the substrate 11b. The length directions of the aluminum electrodes 15a and the transparent electrodes 15b are perpendicular to each other, and pixels are respectively formed at the intersections of the aluminum electrodes 15a and the transparent electrodes 15b. Therefore, many pixels are arranged in a dot matrix on the liquid crystal panel 1. The transparent electrodes 15b are made of a light transmitting material, for example, such as ITO (Indium Tin oxide; indium tin compound) or the like.

Also, electrodes having a character, a figurer, or another appropriate pattern may be formed on the inner surface of each of the substrates in place of the stripe-shaped aluminum electrodes 15a or transparent electrodes 15b.

The thickness of the aluminum electrodes 15a is preferably about 0.01 to 0.5 µm. With the aluminum electrodes 15a having a thickness less than the above range, sufficient conductivity cannot be secured, while with a thickness over the above range, nicks or gouges, which will be described below, cannot be easily observed.

As shown in FIG. 2, an overcoat layer 16a which is an inorganic film is provided on the aluminum electrodes 15a (below the aluminum electrodes 15a in FIG. 2) of the substrate 11a to cover the entire display region where the pixels are arranged. Furthermore, an alignment film 17a made of, for example, a polyimide resin is provided on the overcoat layer 16a to cover the entire display region.

Also, an overcoat layer 16b which is an inorganic film is provided on the transparent electrodes 15b (on the transparent electrodes 15b in FIG. 2) of the substrate 11b to cover the entire display region where the pixels are arranged. Furthermore, an alignment film 17b made of, for example, a polyimide resin is provided on the overcoat layer 16b to cover the entire display region.

As shown in FIG. 2, the substrate 11a comprises an overhang portion 30 projecting leftward from the left end of the substrate 11b shown in FIG. 2. The overhang portion 30 comprises a plurality of terminals 31 (connecting terminals) which are formed by extending the aluminum electrodes 15a to the end of the substrate 11a. As shown in FIG. 2, the regions of the aluminum electrodes 15a, on which the overcoat layer 16a and the alignment film 17a are not formed, and which are exposed to the inside of the substrate 11a, function as the terminals 31.

As shown in FIG. 1, the mounting structure 2 comprises a wiring substrate 21, liquid crystal driving IC 22 mounted on the wiring substrate 21, and chip components 23 mounted on the wiring substrate 21.

The wiring substrate 21 is formed by forming a wiring pattern 25 of Cu or the like on a flexible base substrate 24 of polyimide or the like. The wiring pattern 25 may be fixed to the base substrate 24 with an adhesive layer, or fixed directly on the base substrate 24 by a deposition method such as a sputtering method, a roll coating method, or the like. The wiring substrate 21 can also be produced by forming the wiring pattern of Cu or the like on a relatively hard and thick substrate such as an epoxy substrate.

Mounted components are mounted on a flexible substrate used as the wiring substrate 21 to form a COF (Chip On Film) system mounting structure, while mounted components are mounted on a hard substrate used as the wiring substrate 21 to form a COB (Chip On Board) system mounting structure.

As shown in FIG. 1, the wiring pattern 25 comprises a plurality of output terminals 25a (connection portion of an external circuit) formed on one end side of the wiring substrate 21, a plurality of input terminals 25b formed on the other end side of the wiring substrate 21, and a plurality of IC terminals 25c provided in a region to which the liquid crystal driving IC 22 is mounted.

The liquid crystal IC 22 comprises a plurality of bumps 22a provided on the connection surface, i.e., the active surface, each of the bumps 22a being electrically connected to the predetermined IC terminals 25c through ACF (anisotropic conductive film) 26. The chip components 23 are mounted at the predetermined positions on the wiring substrate 21 by soldering. Possible examples of the chip components 23 include active components such as a capacitor, a resistor, and the like, electronic elements such as a connector, and the like.

The mounting structure 2 is connected to the terminals 31 formed on the overhang portion 30 of the substrate 11a through the ACF 32. As shown in FIG. 2, the ACF 32 comprises an adhesive resin 32a and conductive particles 32b mixed in the adhesive resin 32a so that the end of the mounting structure 2 where the output terminals 25a are formed is bonded to the overhang portion 30 of the 11a with the adhesive resin 32a. Also, the terminals 31 and the output terminals 25a opposed to each other are electrically connected through the conductive particles 32b held between the mounting structure 2 and the substrate 11a. As shown in FIG. 2, the space formed between the base substrate 24 and the substrate 11b is sealed with a resin molding material 34.

In connecting the mounting structure 2 to the terminals 31, a thermal compression bonding head is pressed on the mounting structure 2 to apply heat and pressure thereto with the output terminals 25a of the mounting structure 2 placed on the terminals 31 through the ACF 32. As a result, the adhesive resin 32a of the ACF is melted to spread from the position slightly deviating from the left end of the substrate 11a to the left to the position slightly deviating from the right end of the base substrate 24 to the right, as shown in FIG. 2. The thermal compression bonding head is removed to naturally cool the ACF 32, solidifying the adhesive resin 32a in the state wherein the output terminals 25a are electrically connected to the terminals 31 through the conductive particles 32b.

Although, in the first embodiment, the terminals 31 are made of aluminum, the connection state can be observed through the substrate 11a from the above of FIG. 2 because the terminals 31 have a relatively small thickness. Namely, with sufficient heat and pressure supplied by the thermal compression bonding head, the conductive particles 32b are pressed on the terminals 31 to cut into the terminals 31, as shown in FIG. 2. Therefore, the thickness of the portions of the terminals 31 where the conductive particles 32 cut into the terminals 31 is decreased to increase the light transmittance as compared with the other portions. Therefore, by observing the terminals 31 through the substrate 11a under an optical microscope, the portions where the conductive particles 32b cut into the terminals 31 can be recognized as the nicks or gouges. In this case, the conductive particles 32b are preferably made of a harder material than an aluminum film.

Figure 3:
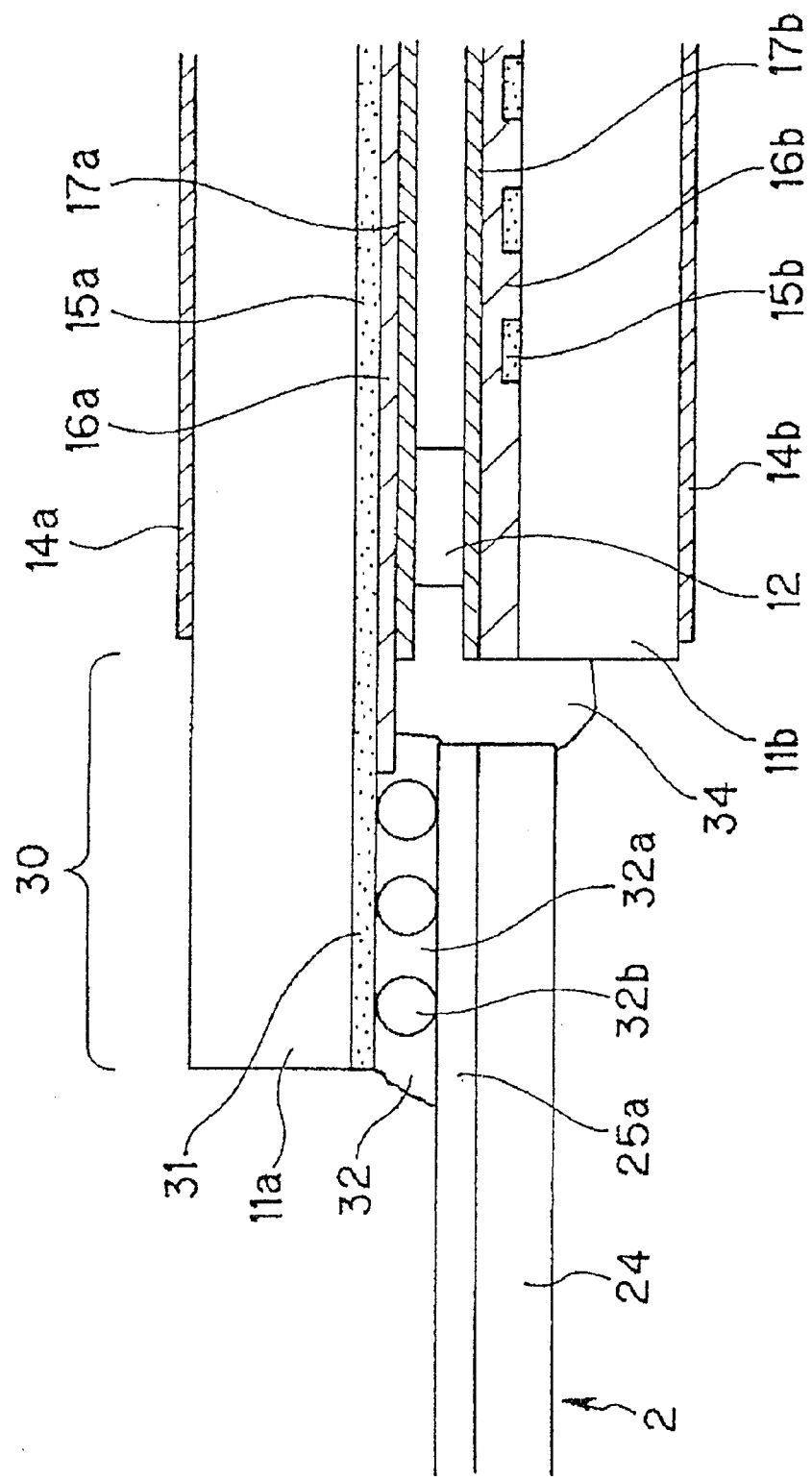
FIG. 3 is a sectional view a case in which in the liquid crystal device of the first embodiment, heat or pressure applied by a thermal compression bonding head is insufficient.

On the other hand, with insufficient heat or pressure supplied by the thermal compression bonding head, the conductive particles 32b do not cut into the terminals 31, as shown in FIG. 3, thereby failing to obtain a stable connection state between the terminals 31 and the output terminals 25a. In this case, the above-described nicks or gouges are not observed, and thus the terminals 31 can be observed through the substrate 11a to decide whether or not the connection state is normal after the mounting structure 2 is connected to the liquid crystal panel 1 in the manufacturing process.

Second Embodiment

A liquid crystal device according to a second embodiment of the present invention will be described as an example of electrooptic devices of the present invention with reference to FIGS. 4 to 7. In the second embodiment, the liquid crystal device of the present invention is applied to a COG (Chip On Glass) system device.

Figure 4:
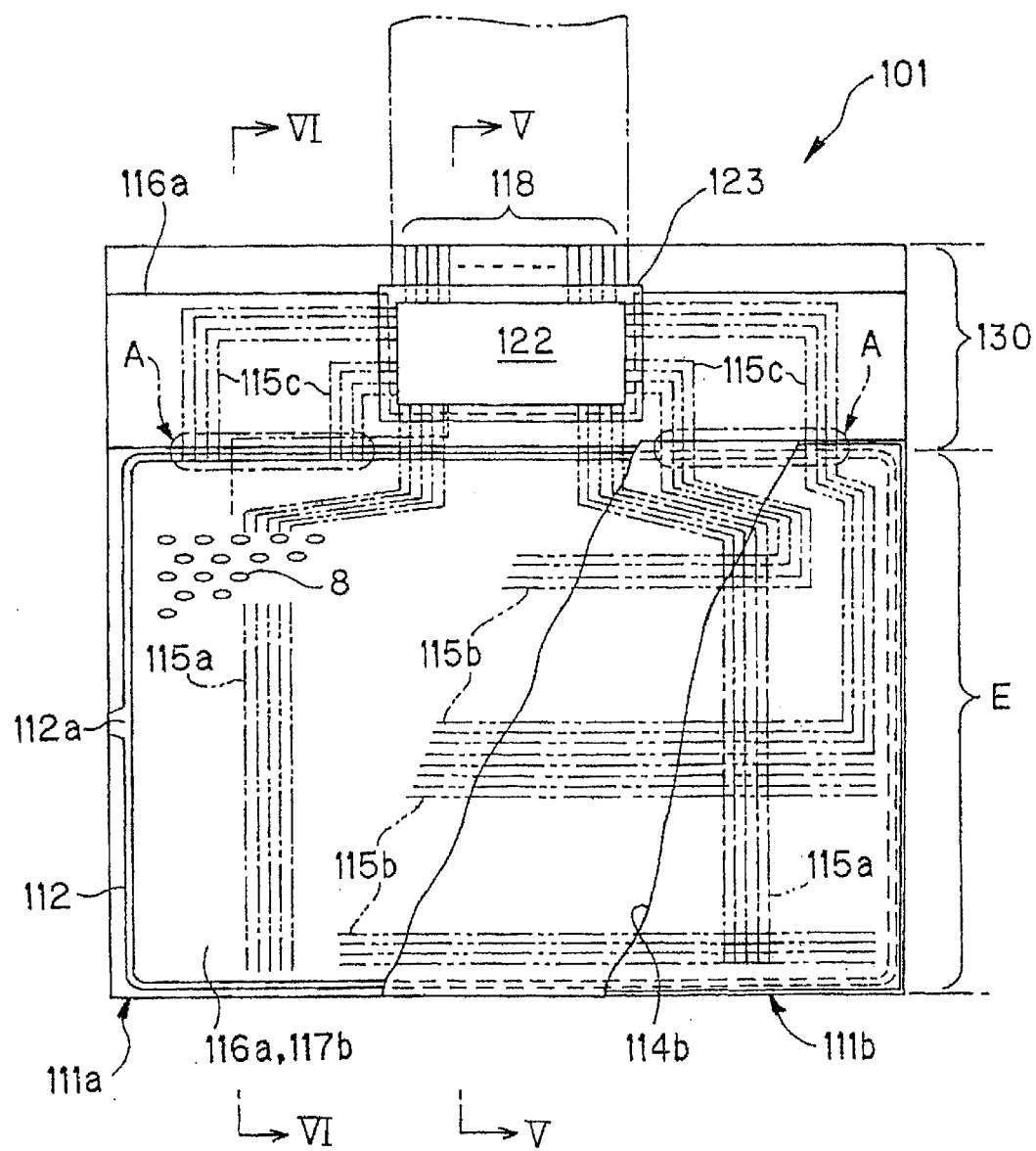
FIG. 4 is a partially cut away plan view showing a liquid crystal device according to a second embodiment of the present invention.
Figure 5:
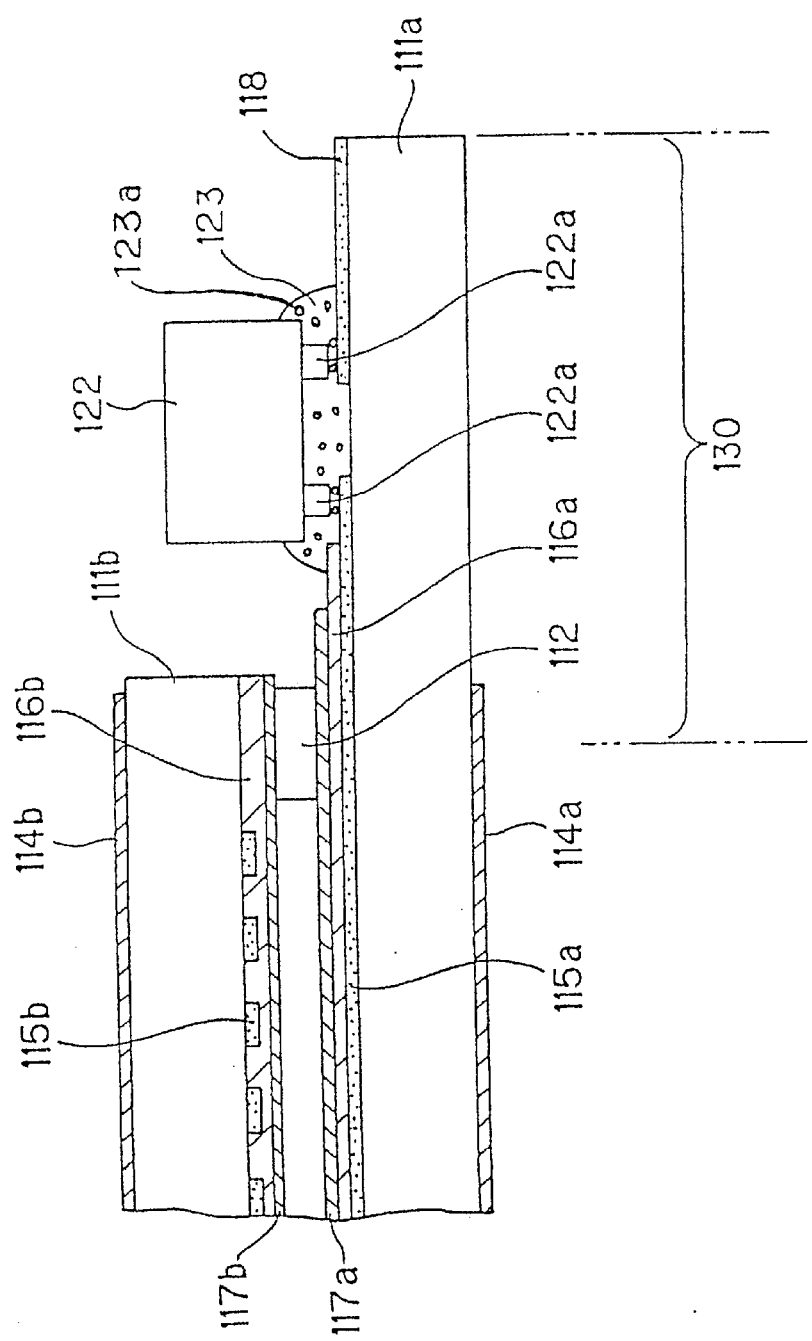
FIG. 5 is a sectional view taken along line V—V in FIG. 4.
Figure 6:
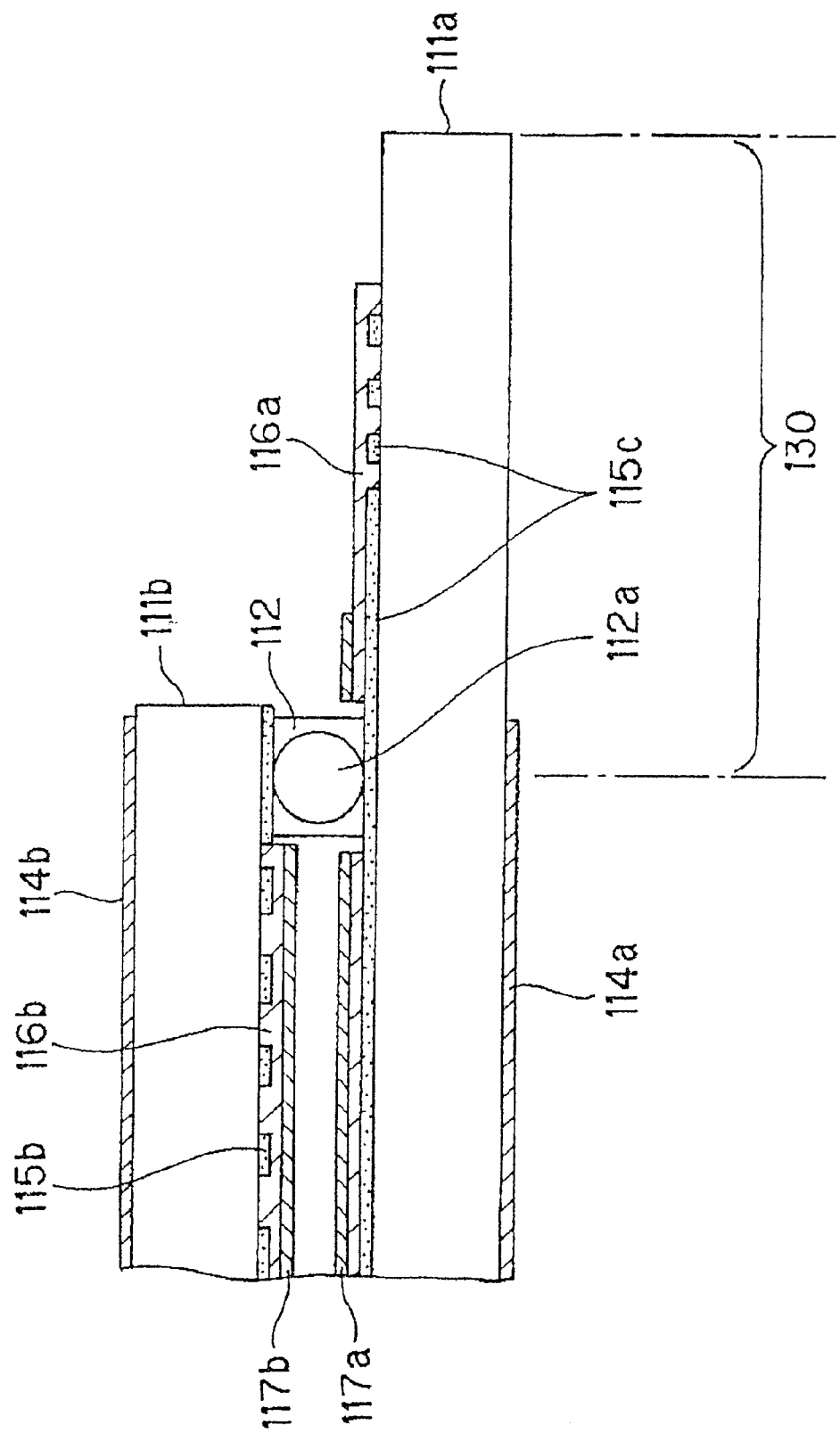
FIG. 6 is a sectional view taken along line VI—VI in FIG. 4.
Figure 7:
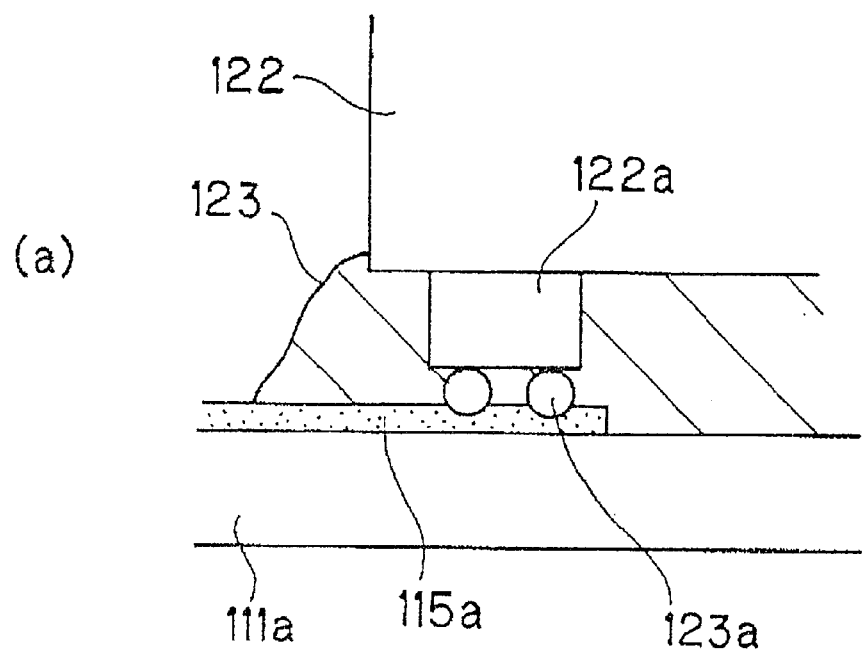
Figure 7:
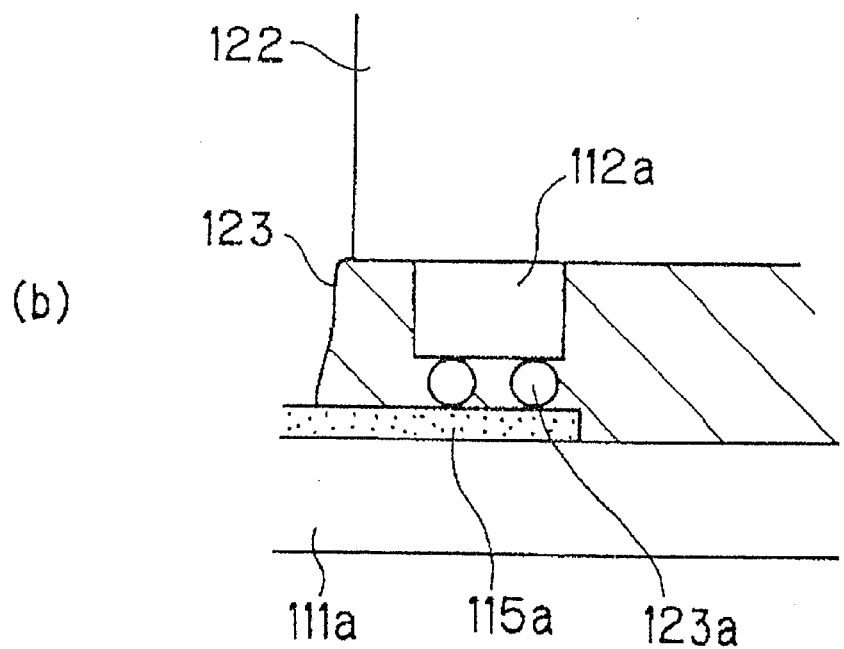

FIG. 4 is a plan view showing the arrangement relation of elements of a liquid crystal panel used in the liquid crystal device of the second embodiment, FIG. 5 is a sectional view taken along line V—V of FIG. 4, and FIG. 6 is a sectional view taken along line VI—VI of FIG. 4.

As shown in FIGS. 4 to 6, a liquid crystal device 101 comprises a pair of substrates 111a and 111b made of a light transmitting material such as glass, a synthetic resin, or the like. The substrates 111a and 111b are bonded together by using a sealing material 112 arranged in the peripheries of both substrates, and a liquid crystal is sealed in the space, i.e., the cell gap, formed between the substrates 111a and 111b in the region surrounded by the sealing material 112. Furthermore, polarizers 114a and 114b are bonded to the outer surfaces of the substrates 111a and 111b, respectively.

A plurality of aluminum electrodes 115a are formed in a stripe shape on the inner surface of the substrate 111a, and a plurality of transparent electrodes 115b are formed in a stripe shape on the inner surface of the substrate 111b. The length directions of the aluminum electrodes 115a and the transparent electrodes 115b are perpendicular to each other, and pixels are respectively formed at the intersections of the aluminum electrodes 115a and the transparent electrodes 115b. Therefore, many pixels are arranged in a dot matrix on the liquid crystal panel 101. The transparent electrodes 115b are made of a light transmitting material, for example, such as ITO (Indium Tin oxide; indium tin compound) or the like.

Also, electrodes having a character, a figurer, another appropriate pattern may be formed on the inner surface of each of the substrates in place of the stripe-shaped aluminum electrodes 115a or transparent electrodes 115b.

The thickness of the aluminum electrodes 115a is preferably about 0.01 to 0.5 $\mu$m. With the aluminum electrodes 115a having a thickness less than the above range, sufficient conductivity cannot be secured, while with a thickness over the above range, the nicks or gouges, which will be described below, cannot be easily observed.

As shown in FIG. 4, the substrate 11a comprises an overhang portion 130 projecting leftward from the substrate 111b opposed to the substrate 111a shown in FIG. 4. An overcoat layer 116a, which is an inorganic film, is provided on the aluminum electrodes 115a (above the aluminum electrodes 115a in FIG. 5) of the substrate 111a in a region ranging from the display region E of the substrate 111a to the overhang portion 130. Furthermore, an alignment film 117a made of, for example, a polyimide resin is provided on the overcoat layer 116a to cover the entire display region E of the substrate 111a.

Also, an overcoat layer 116b, which is an inorganic film, is provided on the transparent electrodes 115b (below the transparent electrodes 115b in FIG. 5) of the substrate 111b to cover the entire display region E. Furthermore, an alignment film 117b made of, for example, a polyimide resin is provided on the overcoat layer 116b to cover the entire display region E.

In the overhang portion 130, liquid crystal driving IC 122 (external circuit) is mounted, and aluminum electrodes 115a extending from the display region E are formed to serve as connecting terminals connected to the liquid crystal driving IC 122. The aluminum electrodes 115a are connected to the liquid crystal deriving IC 122. In the overhang portion 130, aluminum electrodes 115c are further formed for connecting the display region E and the liquid crystal driving IC 122. The aluminum electrodes 115c partly serve as connecting terminals connected to the liquid crystal driving IC 122. The aluminum electrodes 115c are connected to the transparent electrodes 115b of the substrate 111b with the sealing material 112. This connection structure will be described later. The overhang portion 130 further comprises a plurality of input terminals 118 which are provided at the end thereof (the upper end shown in FIG. 4) for connecting the external circuit. The input terminals 118 are partly connected as connecting terminals to the liquid crystal driving IC 122.

In the region denoted by character "A" in FIG. 4, a structure is formed for connecting the transparent electrodes 115b and the aluminum electrodes 115c. In this region, as shown in FIG. 6, the overcoat layer 116a, the alignment film 117a, the overcoat layer 116b and the alignment film 117b are not formed in the portion where the sealing material is provided. Therefore, by assembling the liquid crystal panel 101 with the sealing material 112, the transparent electrodes 115b are electrically connected to the aluminum electrodes 115c through the sealing conductor 112a contained in the sealing material 112.

As shown in FIGS. 5 and 7(a), the predetermined bumps 122a of the liquid crystal driving IC 122, which serve as the connections of the external circuit, are connected to the aluminum electrodes 115a, the aluminum electrodes 115c and the input terminals 118 through ACF 123. As shown in FIG. 7(a), the ACF 123 comprises conductive particles 123a mixed in an adhesive resin so that the liquid crystal driving IC 122 and the substrate 111a are bonded together with the adhesive resin by the thermal compression bonding method.

FIG. 7(a) is a sectional view showing the connections between the aluminum electrodes 15a and the bumps 122a. As shown in FIG. 7(a), the conductive particles 123a of the ACF 123 cut into the aluminum electrodes 115a to obtain a good connection state. In observation of the portions where the conductive particles 123a cut into the aluminum electrodes 115a from below in FIG. 7(a) through the transparent substrate 111a, the portions are recognized as nicks or gouges. Like the aluminum electrodes 115a, the conductive particles 123a also cut into the aluminum electrodes 115c and the input terminals 118 in the connections with the bumps 122a. Like the aluminum electrodes 115a, the nicks or gouges of the aluminum electrodes 115c and the input terminals 118 can be observed through the substrate 111a.

On the other hand, FIG. 7(b) shows the state wherein the heat or pressure supplied from the thermal compression bonding head is insufficient to fail to obtain the stable connection state. In the state shown in FIG. 7(b), the conductive particles 123a do not cut into the bumps 122a, and thus the above-described nicks or gouges are not observed. Therefore, in the manufacturing process, the aluminum terminals 115a are observed through the substrate 111a after the liquid crystal driving IC 122 is connected to the substrate 111a so that a decision can be made as to whether or not the connection state of each connection portion is normal. The connection state of each of the connection portions between the aluminum electrodes 115c and the input terminals and the bumps 122a can also be decided by the same method as the above.

In the second embodiment, the conductive particles 123a contained in the anisotropic conductive film are preferably made of a harder material than an aluminum film material used for connecting terminals.

In addition, the conductive particles are cut into an aluminum film of each of the connecting terminals, which is an opaque film, to permit observation of unevenness of the aluminum film, i.e., adhesion between the conductive particles 123a and the aluminum film, from the side opposite to the side of the transparent substrate connected to the external circuit. It is thus possible to clearly determine the criteria for inspection, and thus manufacture a liquid crystal device having light reliability.

Embodiment of Electronic Apparatus

Figure 8:
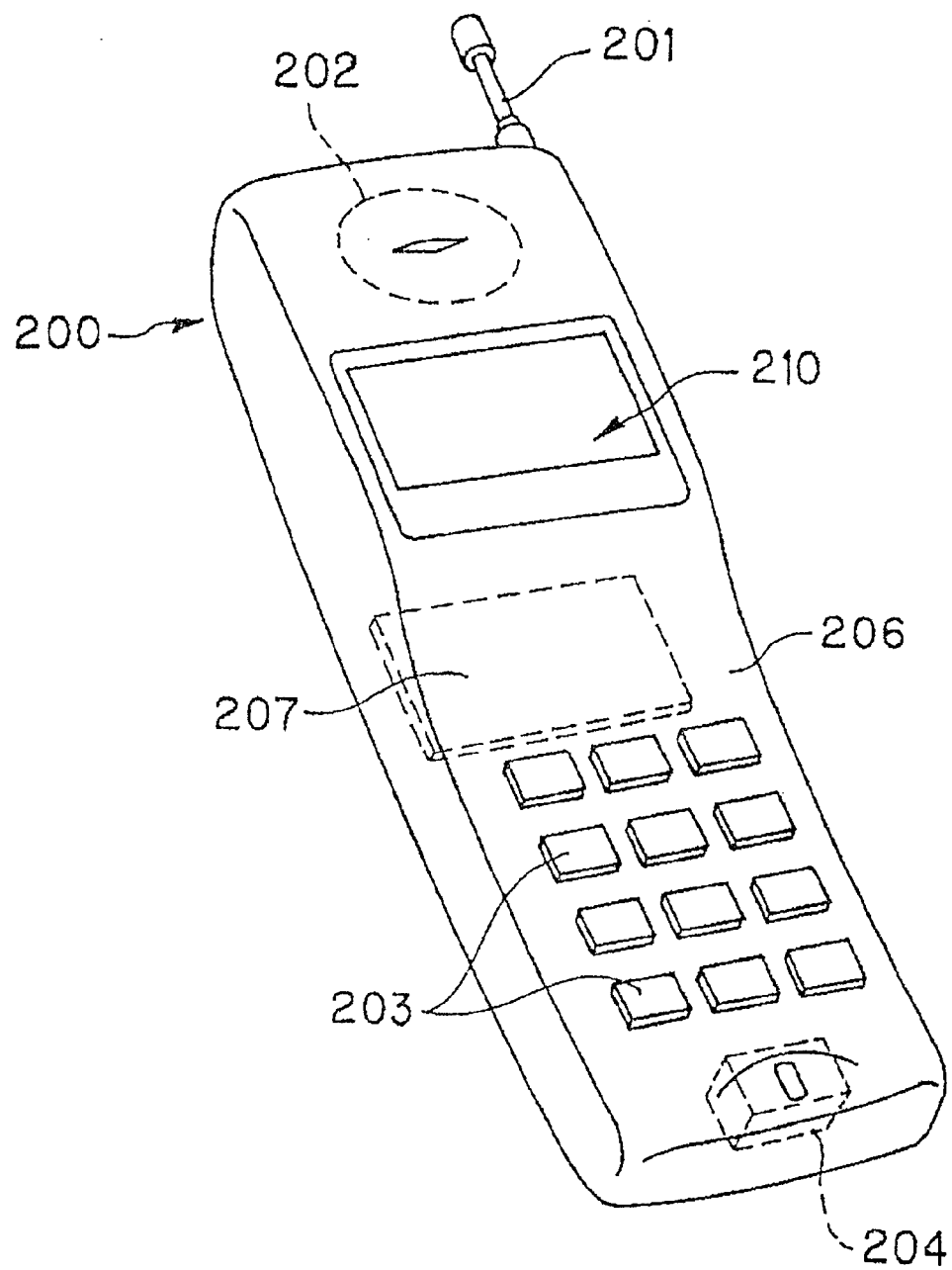
FIG. 8 is a perspective view showing an electronic apparatus according to an embodiment of the present invention.

FIG. 8 shows a portable telephone as an electronic apparatus in accordance with an embodiment of the present invention. The portable telephone 200 shown in this figure comprises various components such as an antenna 201, a speaker 202, a liquid crystal device 210, a key switch 203, a microphone 204, etc., which are contained in an outer case 206 serving as a casing. The outer case 206 contains a control circuit board 207 provided therein and comprising a control circuit for controlling the operation of each of the components. The liquid crystal device 210 can be constructed by the liquid crystal device 100 shown in FIG. 1, or a liquid crystal device comprising the liquid crystal panel 101 shown in FIG. 4.

In the portable telephone 200, signals input through the key switch 203 and the microphone 204, received data received by the antenna 201, and the like are input to the control circuit of the control circuit board 207. The control circuit displays an image such as a figure, a character, a pattern, or the like in the display screen of the liquid crystal device 200 based on the input various data, and further transmits transmit data through the antenna 201.

Other Embodiment

Although the present invention is described above with reference to the preferred embodiments, the present invention is not limited to the embodiments, and various changes can be made in the scope of the claims of the present invention.

For example, although the first and second embodiments relate to a simple matrix system liquid crystal device, the present invention can be applied to an active matrix system liquid crystal device.

Although, in the above embodiments, use of a liquid crystal display as an electrooptic device is described, the present invention is not limited to this, and the present invention can also be applied to a connection structure between an external circuit and any of various electrooptic panels such as a EL display device, a plasma display panel, a FED (field emission display), and the like.

Although, in the embodiment of the electronic apparatus, the present invention is applied to a portable telephone as an electronic apparatus, the liquid crystal device of the present invention can also be applied to any other electronic apparatus, for example, a personal digital assistant, an electronic notebook, a finder of a video camera, etc.

What is claimed is:

1. An electro-optical device comprising:

a transparent substrate and a counter substrate which are opposed to each other and comprise electrodes formed on opposite surfaces thereof;

an overhang portion provided on the transparent substrate to project outward relative to the counter substrate;

connecting terminals formed on the overhang portion to be electrically connected to the electrodes; and a connection portion of an external circuit electrically connected to the connecting terminals through an anisotropic conductive film;

wherein conductive particles contained in the anisotropic conductive film cut into the connecting terminals to form nicks or gouges which are visible through the transparent substrate.

2. An electrooptic device according to claim 1, wherein the connecting terminals are formed to a thickness of 0.05 to 0.5 $\mu$m.

3. The electro-optical device according to claim 1, wherein the penetration of the nicks or gouges is 0.01 $\mu$m or more.

4. The electro-optical device according to claim 1, wherein the connecting terminals proximate the nicks or gouges have a thickness of 0.5 $\mu$m or less.

5. The electro-optical device according to claims 1, wherein the electro-optical device is a liquid crystal device.

6. A method of manufacturing an electro-optical device including: a transparent substrate and a counter substrate which are opposed to each other and comprise electrodes formed on opposite surfaces thereof; an overhang portion provided on the transparent substrate to extend outward relative to the counter substrate; connecting terminals formed on the overhang portion to be electrically connected to the electrodes; and a connection portion of an external circuit electrically connected to the connecting terminals through an anisotropic conductive film; the method comprising: the step of heating the anisotropic conductive film and compression-bonding the connecting terminals and the connection portion of the external circuit together to electrically connect the connecting terminals and the connection portion of the external circuit and the step of determining the connection state between the connecting terminals and the external circuit based on the presence of nicks or gouges formed by conductive particles contained in the anisotropic conductive film cutting into the connecting terminals which are visible through the transparent substrate.

7. An electronic apparatus comprising an electro-optical device according to claim 1.

8. An electro-optical device comprising: a substrate; connecting terminals disposed on a portion of said substrate; an external circuit; a plurality of conductive particles dispersed in an anisotropic conductive film connected between said external circuit and said connecting terminals; and nicks in said connecting terminals formed by said conductive particles which are visible through the transparent substrate.

9. The electro-optical device of claim 8, wherein the connecting terminals further comprise aluminum.

10. The electro-optical device of claim 8, wherein the connecting terminals are approximately 0.01 to 0.5 $\mu$m thick.

11. The electro-optical device of claim 8, wherein the nicks penetrate about 0.01 $\mu$m or more into said connecting terminals.

12. The electro-optical device of claim 8, wherein the conductive particles comprise a harder material than the connecting terminals.

13. The electro-optical device of claim 8, wherein said substrate comprises a transparent material.

14. A method of manufacturing an electro-optical device comprising: heating an anisotropic conductive film and compression-bonding a connection portion of an external circuit to connecting terminals of a first substrate; forming a plurality of nicks in said connecting terminals with a plurality of conductive particles dispersed in said anisotropic conductive film; and determining whether said external circuit is conductively connected to said substrate by observing said nicks through said first substrate.

15. The method according to claim 14, wherein a depth of said nicks is equal to or greater than 0.01 $\mu$m.

16. A liquid crystal display device comprising:

a first substrate having at least a portion which is transparent;

a second substrate opposite the first substrate;

a liquid crystal enclosed between the first and second substrates;

a terminal formed on the first substrate;

an external circuit on which a wiring pattern is formed, the external circuit being bonded to the terminal;

a conductive particle connecting the terminal to the wiring pattern; and a nick portion formed on the terminal from contact with said conductive particle, the nick portion being thinner than another portion of the terminal such that the nick portion is observable through the first substrate.

17. The device of claim 16, wherein the conductive particle comprises a material that is harder than the terminal.

18. The device of claim 16, further comprising an adhesive resin that bonds the external circuit to the first substrate.

19. The device of claim 18, wherein the conductive particle is mixed into the adhesive resin.

20. The device of claim 16, further comprising:

a reflective layer formed on the first substrate for reflecting external light incident on the device; and wherein the terminal is arranged at an end portion of the reflective layer, the terminal being in substantially the same layer as the reflective layer.

21. The device of claim 16, further comprising a plurality of conductive particles; and a plurality of nick portions, each of which corresponds to each of the conductive particles.

22. The device of claim 16, wherein the nick portion of the terminal is transparent; and another portion other than the nick portion of the terminal is opaque.

23. The device of claim 16, wherein the terminal comprises aluminum.

24. A liquid crystal display device comprising: a first substrate having at least a portion which is transparent; a second substrate opposite the first substrate; a liquid crystal enclosed between the first and second substrates; a terminal formed on the first substrate; an external circuit on which a wiring pattern is formed, the external circuit being bonded to the terminal; and a conductive particle connecting the terminal to the wiring pattern, wherein the terminal includes a first portion and a second portion, the first portion having a higher transparency than the second portion, and wherein the conductive particle is arranged on the first portion which is visible through the first substrate.

25. A liquid crystal display device comprising:

a first substrate having at least a portion which is transparent;

a second substrate opposite the first substrate;

a liquid crystal enclosed between the first and second substrates;

a terminal formed on the first substrate;

an IC on which a bump is formed, the IC being bonded to the terminal;

a conductive particle connecting the terminal to the bump; and a nick portion formed on the terminal from contact with said conductive particle, the nick portion being thinner than another portion of the terminal such that the nick portion is observable through the first substrate.

26. The device of claim 25, wherein the conductive particle comprises a material that is harder than the terminal.

27. The device of claim 25, further comprising an adhesive resin that bonds the IC to the first substrate.

28. The device of claim 27, wherein the conductive particle is mixed into the adhesive resin.

29. The device of claim 25, further comprising:

a reflective layer formed on the first substrate for reflecting external light incident on the device; and wherein the terminal is arranged at an end portion of the reflective layer, the terminal being in substantially the same layer as the reflective layer.

30. The device of claim 25, further comprising a plurality of conductive particles; and a plurality of nick portions, each of which corresponds to each of the conductive particles.

31. The device of claim 25, wherein the nick portion of the terminal is transparent and;

another portion other than the nick portion of the terminal is opaque.

32. The device of claim 25, wherein the terminal comprises aluminum.

33. A liquid crystal display device comprising: a first substrate having at least a portion which is transparent; a second substrate opposite the first substrate; a liquid crystal enclosed between the first and second substrates; a terminal formed on the first substrate; an IC on which a bump is formed, the IC being bonded to the terminal; and a conductive particle connecting the terminal to the bump, wherein the terminal includes a first portion and a second portion, the first portion having a higher transparency than the second portion, and wherein the conductive particle is arranged on the first portion which is visible through the first substrate.

34. An electro-optical device comprising: a substrate; a terminal formed on the substrate; said terminal including a first portion and a second portion, the second portion being thicker than that of the first portion; an external circuit bonded to the terminal; and a conductive particle arranged on the first portion of the terminal for connecting the terminal to the external circuit, the first portion being visible and recognizable through the substrate.

* * * * *